(12) United States Patent
Wu

(10) Patent No.: US 11,128,272 B2
(45) Date of Patent: Sep. 21, 2021

(54) DUAL-PATH ANALOG-FRONT-END CIRCUIT AND DUAL-PATH SIGNAL RECEIVER

(71) Applicant: REALTEK SEMICONDUCTOR CORPORATION, Hsinchu (TW)

(72) Inventor: Chien-Ming Wu, Hsinchu County (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 187 days.

(21) Appl. No.: 16/428,109

(22) Filed: May 31, 2019

(65) Prior Publication Data

US 2020/0059211 A1    Feb. 20, 2020

(30) Foreign Application Priority Data

Aug. 17, 2018  (TW) .................................. 107128844

(51) Int. Cl.
*H03F 1/07* (2006.01)
*H03F 3/45* (2006.01)
(Continued)

(52) U.S. Cl.
CPC ........ *H03F 3/45071* (2013.01); *H03M 3/466* (2013.01); *H04L 5/00* (2013.01); *H04L 25/0264* (2013.01); *H03F 2203/45526* (2013.01)

(58) Field of Classification Search
CPC ..................................... H03F 1/07; H03F 1/02
(Continued)

(56) References Cited

U.S. PATENT DOCUMENTS 8,476,938 B2   7/2013  Sung et al.
8,670,853 B2   3/2014  Chiu et al.
(Continued)

FOREIGN PATENT DOCUMENTS

CN   102404909 A   4/2012
TW   201223168     6/2012
TW   201505361     2/2015

OTHER PUBLICATIONS

Jan Mulder et al., "An 800MS/s 10b/13b Receiver for 10GBASE-T Ethernet in 28nm CMOS", ISSCC 2015 / Session 26 / NYQUIST-Rate Converters / 26.3.
(Continued)

*Primary Examiner* — Henry Choe
(74) *Attorney, Agent, or Firm* — WPAT, PC

(57) ABSTRACT

Disclosed are a dual-path analog-front-end (AFE) circuit and a dual-path signal receiver characterized by high linearity. The dual-path AFE circuit includes a first reception circuit, a second reception circuit and a multiplexer. The first reception circuit is configured to generate a first analog input signal according to a reception signal in a first mode and configured to be coupled to a first constant-voltage terminal via a first switch circuit in a second mode. The second reception circuit is configured to generate a second analog input signal according to the reception signal in the second mode and configured to be coupled to a second constant-voltage terminal via a second switch circuit in the first mode. The multiplexer is configured to output the first analog input signal in the first mode and output the second analog input signal in the second mode.

16 Claims, 5 Drawing Sheets

(51) Int. Cl.
*H03M 3/00* (2006.01)
*H04L 5/00* (2006.01)
*H04L 25/02* (2006.01)

(58) Field of Classification Search
USPC .............................................. 330/124 R, 295
See application file for complete search history.

(56) References Cited

U.S. PATENT DOCUMENTS

| | | |
|---|---|---|
| 9,118,286 B2 | 8/2015 | Kao |
| 9,729,109 B2 * | 8/2017 | Shu ........................ H03F 3/211 |
| 2009/0015722 A1 | 1/2009 | Lee et al. |

OTHER PUBLICATIONS

OA letter of counterpart TW application of application No. 107128844 dated Feb. 22, 2019.

\* cited by examiner

DUAL-PATH ANALOG-FRONT-END CIRCUIT AND DUAL-PATH SIGNAL RECEIVER

BACKGROUND OF THE INVENTION

1. Field of the Invention

The present invention relates to an analog-front-end circuit and a signal receiver, especially to a dual-path analog-front-end circuit and a dual-path signal receiver.

2. Description of Related Art

In general, the quality of a reception signal is inversely proportional to the transmission distance of the reception signal without the assistance of a signal relay. Take Ethernet transmission as an example; the transmission distance of Ethernet transmission may be one hundred meters long, and the quality of a reception signal through such long distance is usually not good and therefore a receiver has to use a circuit of relatively high power consumption for processing the reception signal. However, in most circumstances, the transmission distance of a reception signal is usually shorter than thirty meters, and the quality of the reception signal through such short distance is usually good and therefore a receiver can use a circuit of relatively low power consumption for processing the reception signal. In order to adaptively process a reception signal according to its transmission distance, a known receiver uses a long-distance transmission mode circuit and a short-distance transmission mode circuit connected in parallel; when the long-distance transmission mode circuit is selected to process a reception signal of long transmission distance, a switch of the short-distance transmission mode circuit is turned off to make the short-distance transmission mode circuit electrically non-conductive; and when the short-distance transmission mode circuit is selected to process a reception signal of short transmission distance, a switch of the long-distance transmission mode circuit is turned off to make the long-distance transmission mode circuit electrically nonconductive. Although the above-mentioned receiver can adaptively process a reception signal according to its transmission distance, since both the switches (e.g., transistors) of the long-distance transmission mode circuit and the short-distance transmission mode circuit are set on a path used for receiving the reception signal, which implies that the reception signal will be transmitted to a circuit (e.g., an amplifier of the long-distance transmission mode circuit or another amplifier of the short-distance transmission mode circuit) via one of the switches, such positional setting of the switches will affect the linearity of the receiver.

SUMMARY OF THE INVENTION

An object of the present invention is to provide a dual-path analog-front-end (AFE) circuit and a dual-path signal receiver characterized by high linearity.

An embodiment of the dual-path AFE circuit of the present invention includes a first reception circuit, a second reception circuit, and a multiplexer. The first reception circuit includes: a first passive-component circuit configured to generate a first signal according to a reception signal in a first mode; a first switch circuit configured to electrically disconnect the first passive-component circuit from a first voltage terminal in the first mode and electrically connect the first passive-component circuit with the first voltage terminal in a second mode; and a first amplifier circuit configured to generate a first analog input signal according to the first signal in the first mode. The second reception circuit includes: a second passive-component circuit configured to generate a second signal according to the reception signal in the second mode; a second switch circuit configured to electrically disconnect the second passive-component circuit from a second voltage terminal in the second mode and electrically connect the second passive-component circuit with the second voltage terminal in the first mode; and a second amplifier circuit configured to generate a second analog input signal according to the second signal in the second mode. The multiplexer is electrically connected with the first reception circuit and the second reception circuit, and configured to output the first analog input signal in the first mode and output the second analog input signal in the second mode. In an exemplary implementation of this embodiment, the power consumption of the first amplifier circuit in the first mode is more than the power consumption of the second amplifier circuit in the second mode.

Another embodiment of the dual-path AFE circuit of the present invention includes a first reception circuit, a second reception circuit, and a multiplexer. The first reception circuit is configured to generate a first analog input signal according to a reception signal in a first mode and configured to be electrically connected to a first constant-voltage terminal via a first switch circuit in a second mode. The second reception circuit is configured to generate a second analog input signal according to the reception signal in the second mode and configured to be electrically connected to a second constant-voltage terminal via a second switch circuit in the first mode. The multiplexer is configured to output the first analog input signal in the first mode and output the second analog input signal in the second mode. In an exemplary implementation of this embodiment, the power consumption of the first reception circuit in the first mode is more than the power consumption of the second reception circuit in the second mode.

An embodiment of the dual-path signal receiver of the present invention includes a first reception circuit, a second reception circuit, a multiplexer, and an analog-to-digital converter. The first reception circuit is configured to generate a first analog input signal according to a reception signal in a first mode and configured to be electrically connected to a first voltage terminal via a first switch circuit in a second mode. The second reception circuit is configured to generate a second analog input signal according to the reception signal in the second mode and configured to be electrically connected to a second voltage terminal via a second switch circuit in the first mode. The multiplexer is electrically connected to the first reception circuit and the second reception circuit, and configured to output the first analog input signal in the first mode and output the second analog input signal in the second mode. The analog-to-digital converter is configured to generate a first digital signal according to the first analog input signal in the first mode and generate a second digital signal according to the second analog input signal in the second mode. In an exemplary implementation of this embodiment, the reception signal is a wired transmission signal, the first mode is a long-distance transmission mode, and the second mode is a short-distance transmission mode.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a dual-path analog-front-end (AFE) circuit and a dual-path signal receiver, each of which has no need to set switches on a signal reception path and thereby prevents the switches from degrading the linearity. The dual-path AFE circuit and the dual-path signal receiver are applicable to an Ethernet receiver (e.g., a ten gigabit Ethernet receiver) or another kind of wired receivers; however, this is not a limitation on the application of the present invention.

Figure 1:
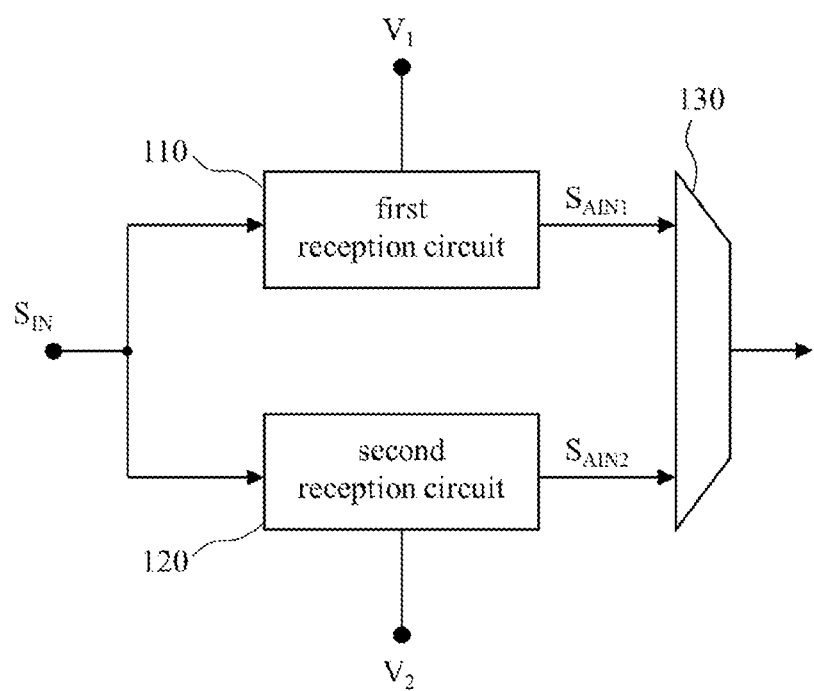
FIG. 1 shows an embodiment of the dual-path analog-front-end circuit of the present invention.

FIG. 1 shows an embodiment of the dual-path AFE circuit of the present invention. The dual-path AFE circuit 100 of FIG. 1 includes a first reception circuit 110, a second reception circuit 120, and a multiplexer 130, in which the first reception circuit 110 and the second reception circuit 120 are connected in parallel. The first reception circuit 110 is configured to generate a first analog input signal $S_{AIN1}$ according to a reception signal $S_{IN}$ in a first mode and configured to be electrically connected with a first voltage terminal $V_1$ via a first switch circuit (e.g., the first switch circuit 112 of FIG. 2) in a second mode, in which an exemplary implementation of the first voltage terminal $V_1$ is a constant-voltage terminal configured to receive a first constant voltage (e.g., a high power supply voltage $V_{DD}$, a low power supply voltage $V_{SS}$, or a ground voltage GND). The second reception circuit 120 is configured to generate a second analog input signal $S_{AIN2}$ according to the reception signal $S_{IN}$ in the second mode and configured to be electrically connected with a second voltage terminal $V_2$ via a second switch circuit (e.g., the second switch circuit 122 of FIG. 2) in the first mode, in which an exemplary implementation of the second voltage terminal $V_2$ is a constant-voltage terminal configured to receive a second constant voltage (e.g., a high power supply voltage $V_{DD}$, a low power supply voltage $V_{SS}$, or a ground voltage GND) which can be equal to or different from the aforementioned first constant voltage. The multiplexer 130 is configured to output the first analog input signal $S_{AIN1}$ in the first mode and output the second analog input signal $S_{AIN2}$ in the second mode.

On the basis of the above, in this embodiment both the first switch circuit and the second switch circuit are not set on a path used for receiving the reception signal $S_{IN}$ and thus the two switch circuits will not effectively affect the linearity of the dual-path AFE circuit 100. In an exemplary implementation of this embodiment, the first mode is a long-distance transmission mode, the second mode is a short-distance transmission mode, the first reception circuit 110 is configured to process a long-distance transmission signal in the first mode, the second reception circuit 120 is configured to process a short-distance transmission signal in the second mode, and accordingly the power consumption of the first reception circuit 110 in the first mode is more than the power consumption of the second reception circuit 120 in the second mode. It should be noted that after reading the present disclosure, people of ordinary skill in the art can appreciate how to use a known or self-developed technique to detect the transmission distance of the reception signal $S_{IN}$, the quality of the reception signal $S_{IN}$, or the communication environment of the dual-path AFE circuit 100 and thereby generate at least one control signal controlling the first switch circuit, the second switch circuit, and the multiplexer 130, in which the at least one control signal determines the dual-path AFE circuit 110 to operate in the first mode or the second mode; it should also be noted that the dual-path AFE circuit 100 can operate in the first mode or the second mode according to user setting with/without the above-mentioned detection.

Figure 2:
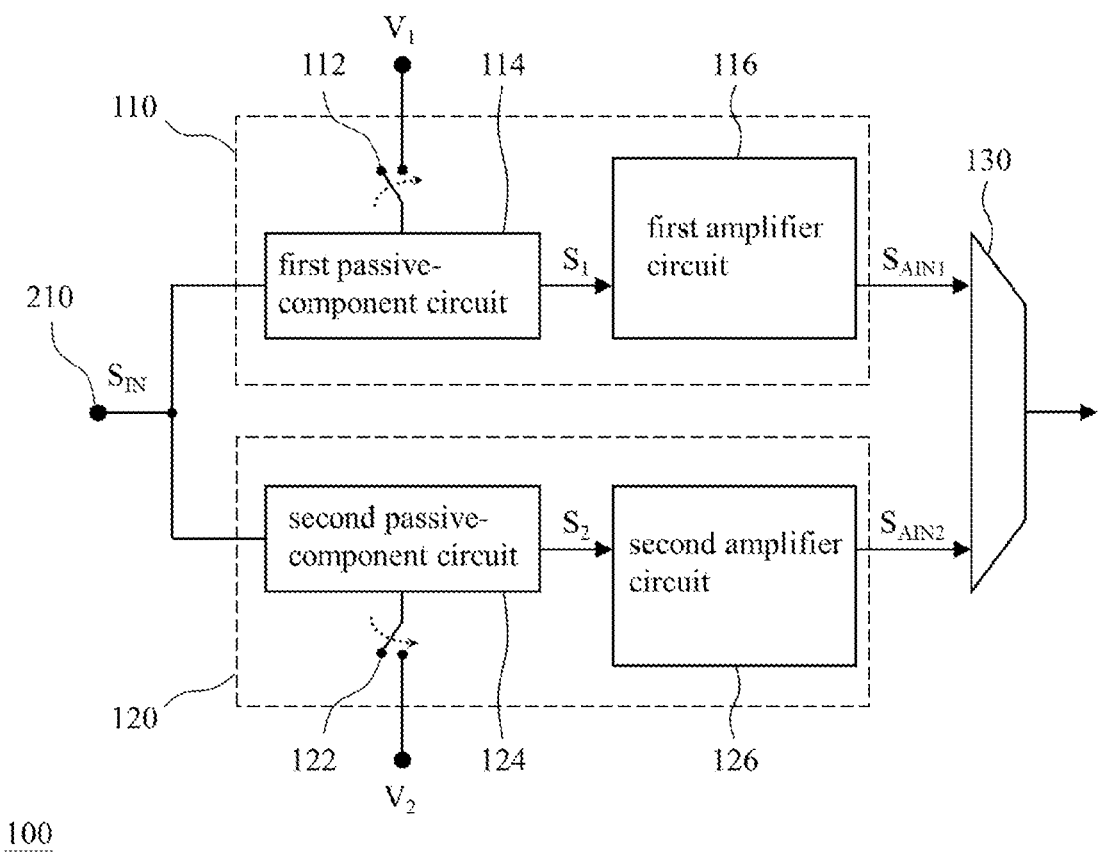
FIG. 2 shows an embodiment of the first reception circuit and the second reception circuit of FIG. 1.

FIG. 2 shows an embodiment of the first reception circuit 110 and the second reception circuit 120 of FIG. 1. As shown in FIG. 2, the first reception circuit 110 includes a first passive-component circuit 114, the aforementioned first switch circuit 112 (e.g., a MOS transistor), and a first amplifier circuit 116 (e.g., an N-order amplifier, in which the N is an integer greater than one); the second reception circuit 120 includes a second passive-component circuit 124, the aforementioned second switch circuit 122 (e.g., a MOS transistor), and a second amplifier circuit 126 (e.g., an M-order amplifier, in which the M is a positive integer not greater than the N of the aforementioned N-order amplifier). The first passive-component circuit 114 is configured to receive the reception signal $S_{IN}$ via a reception terminal 210 in the first mode and thereby generate a first signal $S_1$; the first switch circuit 112 is configured to disconnect the first passive-component circuit 114 from the aforementioned first voltage terminal $V_1$ in the first mode and configured to electrically connect the first passive-component circuit 114 with the first voltage terminal $V_1$ in the second mode; and the first amplifier circuit 116 is configured to generate the aforementioned first analog input signal $S_{AIN1}$ according to the first signal $S_1$ in the first mode. The second passive-component circuit 124 is configured to receive the reception signal $S_{IN}$ via the reception terminal 210 in the second mode and thereby generate a second signal $S_2$; the second switch circuit 122 is configured to disconnect the second passive-component circuit 124 from the aforementioned second voltage terminal $V_2$ in the second mode and configured to electrically connect the second passive-component circuit 124 with the second voltage terminal $V_2$ in the first mode; the second amplifier circuit 126 is configured to generate the aforementioned second analog input signal $S_{AIN2}$ according to the second signal $S_2$ in the second mode. In an exemplary implementation of this embodiment, the power consumption of the first amplifier circuit 116 in the first mode is more than the power consumption of the second amplifier circuit 126 in the second mode; in other words, the first amplifier circuit 116 is capable of processing a reception signal of first signal quality, and the second amplifier circuit 126 is capable of processing a reception signal of second signal quality but may be incapable of processing the reception signal of the first signal quality, in which the first signal quality is lower than the second signal quality.

Figure 3:
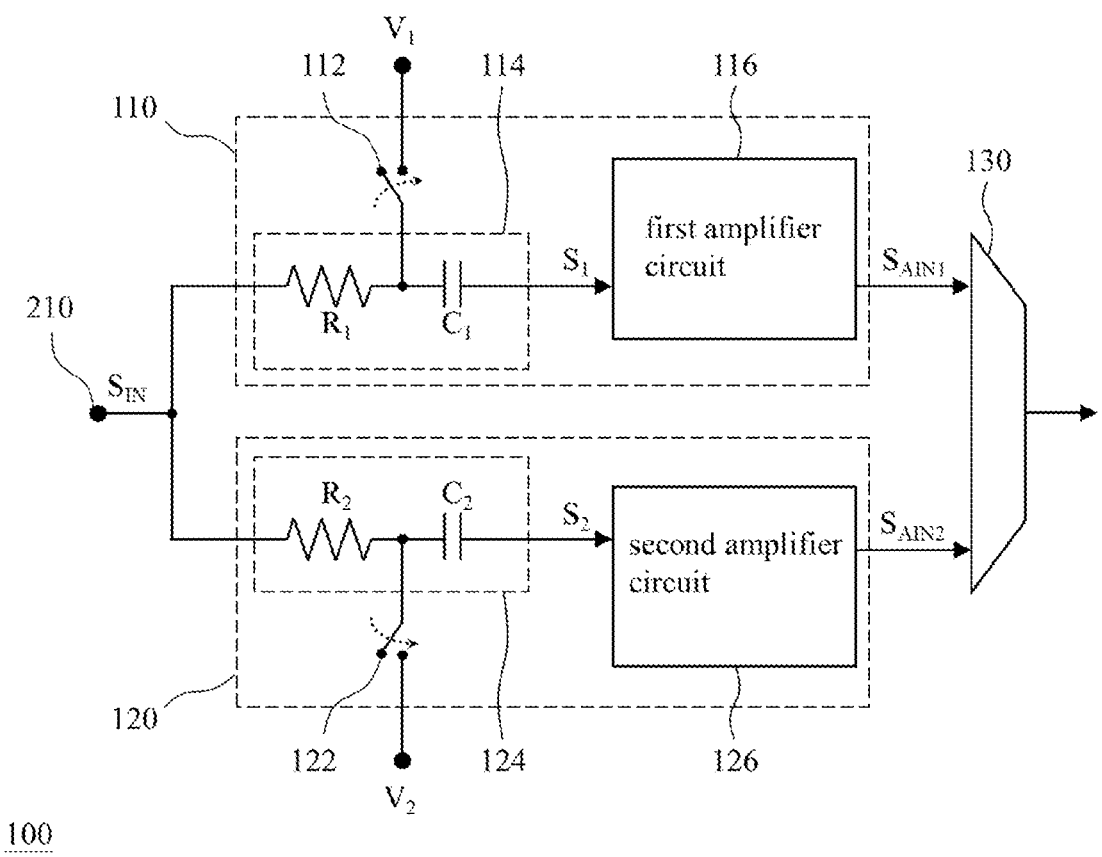
FIG. 3 shows an embodiment of the first passive-component circuit and the second passive-component circuit of FIG. 2.

FIG. 3 shows an embodiment of the first passive-component circuit 114 and the second passive-component circuit 124 of FIG. 2. As shown in FIG. 3, the first passive-component circuit 114 includes a resistor $R_1$ and a capacitor $C_1$ connected in series; the second passive-component circuit 124 includes a resistor $R_2$ and a capacitor $C_2$ connected in series. One terminal of the aforementioned first switch circuit 112 is electrically connected to a node between the resistor $R_1$ and the capacitor $C_1$ and another terminal of the first switch circuit 112 is electrically connected to the aforementioned first voltage terminal $V_1$; similarly, one terminal of the aforementioned second switch circuit 122 is electrically connected to a node between the resistor $R_2$ and the capacitor $C_2$ and another terminal of the second switch circuit 122 is electrically connected to the aforementioned second voltage terminal $V_2$. It should be noted that in the first mode the first switch circuit 112 is electrically nonconductive and the second switch circuit 122 is electrically conductive, and thus a transmission-line terminal impedance $R_m$ (not shown in the figure) electrically connected with the aforementioned reception terminal 210, the equivalent impedance $$\left(\left(R_1 + \frac{1}{jwC_1}\right)\right)$$

of the first reception circuit 110, and the equivalent impedance $R_2$ of the second reception circuit 120 that are connected in parallel will form an impedance $$\left(R_m // R_2 // \left(R_1 + \frac{1}{jwC_1}\right)\right)$$

which can be adaptively determined to match a transmission-line characteristic impedance; similarly, in the second mode the second switch circuit 122 is electrically nonconductive and the first switch circuit 112 is electrically conductive, and thus the transmission-line terminal impedance $R_m$ electrically connected with the reception terminal 210, the equivalent impedance $$\left(\left(R_2 + \frac{1}{jwC_2}\right)\right)$$

of the second reception circuit 120, and the equivalent impedance $R_1$ of the first reception circuit 110 that are connected in parallel will form an impedance $$\left(R_m // R_1 // \left(R_2 + \frac{1}{jwC_2}\right)\right)$$

which can be adaptively determined to match the transmission-line characteristic impedance. The value and type of the above-mentioned transmission-line terminal impedance $R_m$ can be determined in accordance with the demand for implementation.

Figure 4:
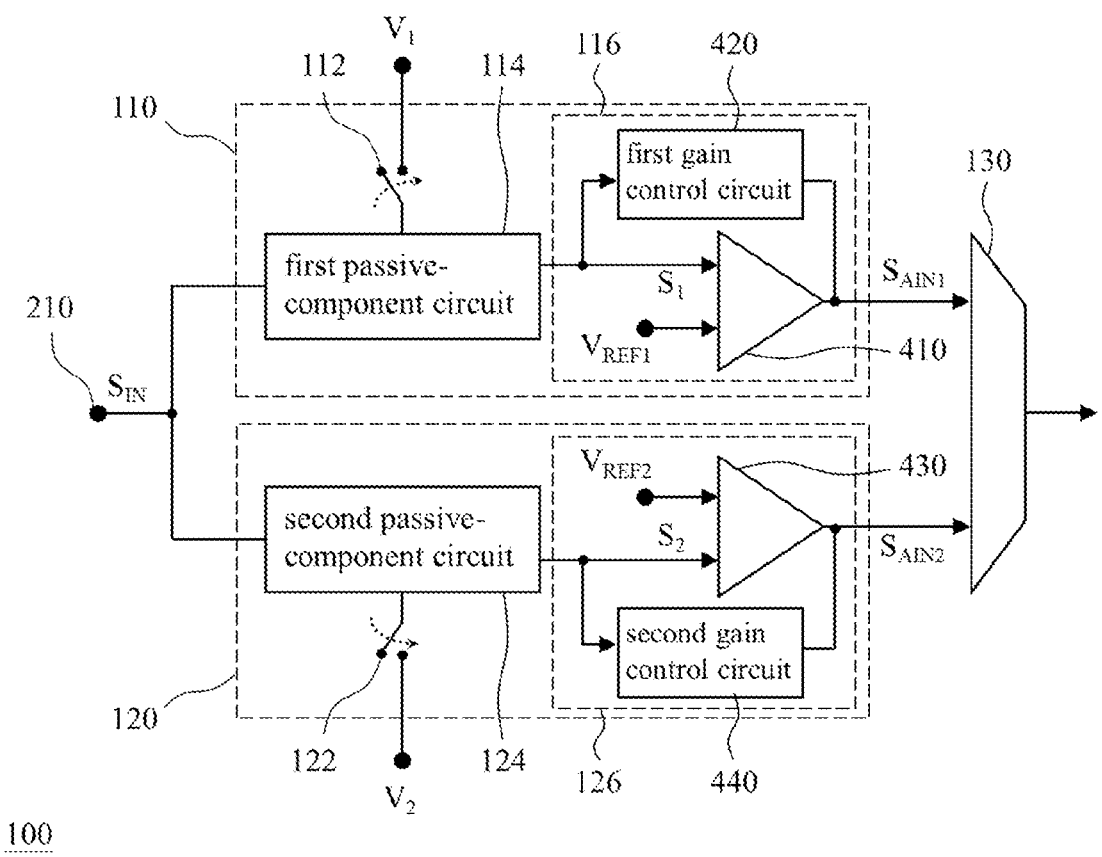
FIG. 4 shows an embodiment of the first amplifier circuit and the second amplifier circuit of FIG. 2.

FIG. 4 shows an embodiment of the first amplifier circuit 116 and the second amplifier circuit 126 of FIG. 2. As shown in FIG. 4, the first amplifier circuit 116 includes a first amplifier 410 and a first gain control circuit 420; the second amplifier circuit 126 includes a second amplifier 430 and a second gain control circuit 440. The first amplifier 410 includes a first input terminal configured to receive the aforementioned first signal $S_1$, a first reference signal terminal configured to receive a first reference signal $V_{REF1}$ (e.g., a ground voltage or a constant voltage), and a first output terminal configured to output the aforementioned first analog input signal $S_{AIN1}$; furthermore, the first amplifier 410 is configured to generate the first analog input signal $S_{AIN1}$ according to the first signal $S_1$ and the first reference signal $V_{REF1}$. The first gain control circuit 420 includes at least one adjustable passive component (e.g., an adjustable resistor between the first input terminal and the first output terminal; or a resistor and a capacitor that are connected in parallel and set between the first input terminal and the first output terminal, in which at least one of the resistor and the capacitor is adjustable) configured to control the gain of the first amplifier circuit 116. The second amplifier 430 includes a second input terminal configured to receive the aforementioned second signal $S_2$, a second reference signal terminal configured to receive a second reference signal $V_{REF2}$ (e.g., a ground voltage or a constant voltage), and a second output terminal configured to output the aforementioned second analog input signal $S_{AIN2}$; furthermore, the second amplifier 430 is configured to generate the second analog input signal $S_{AIN2}$ according to the second signal $S_2$ and the second reference signal $V_{REF2}$. The second gain control circuit 440 includes at least one adjustable passive component (e.g., an adjustable resistor between the second input terminal and the second output terminal; or a resistor and a capacitor that are connected in parallel and set between the second input terminal and the second output terminal, in which at least one of the resistor and the capacitor is adjustable) configured to control the gain of the second amplifier circuit 126.

Figure 5:
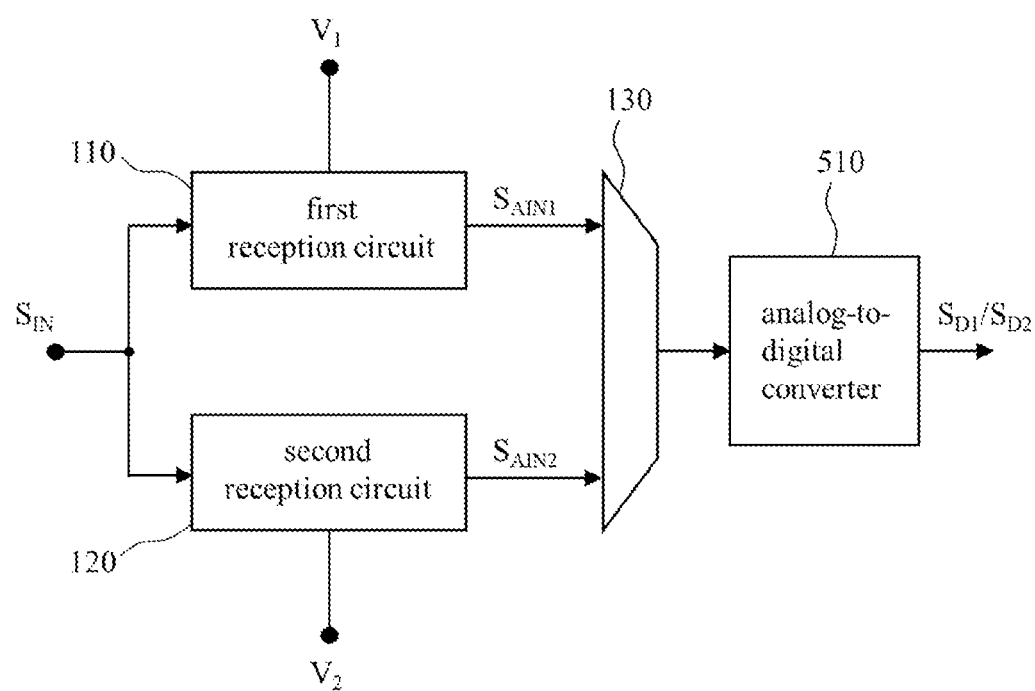
FIG. 5 shows an embodiment of the dual-path signal receiver of the present invention.

FIG. 5 shows an embodiment of the dual-path signal receiver of the present invention. The dual-path signal receiver 500 of FIG. 5 not only includes the dual-path AFE circuit 100 of FIG. 1 but also includes an analog-to-digital converter 510. The analog-to-digital converter 510 is configured to generate a first digital signal $S_{D1}$ according to the aforementioned first analog input signal $S_{AIN1}$ in the first mode and generate a second digital signal $S_{D2}$ according to the aforementioned second analog input signal $S_{AIN2}$ in the second mode. In an exemplary implementation of this embodiment, the analog-to-digital converter 510 is configured to function as a high resolution analog-to-digital converter in the first mode and function as a low resolution analog-to-digital converter in the second mode so that a number of bits of the first digital signal $S_{D1}$ is more than a number of bits of the second digital signal $S_{D2}$; in other words, the first digital signal $S_{D1}$ is composed of a first number of bits, the second digital signal SD2 is composed of a second number of bits, and the first number of bits is more than the second number of bits. It should be noted that the above-mentioned implementation is not a limitation on the implementation of the present invention; in addition, people of ordinary skill in the art can use a known technique (e.g., Jan Mulder, Davide Vecchi, Yi Ke, Stefano Bozzola, Mark Core, Nitz Saputra, Qiongna Zhang, Jeff Riley, Han Yan, Mattia Introini, Sijia Wang, Christopher M. Ward, Jan Westra, Jiansong Wan, Klaas Bult, "An 800MS/s 10b/13b Receiver for 10GBASE-T Ethernet in 28 nm CMOS", FIG. 26.3.1, ISSCC 2015/SESSION 26/NYQUIST-RATE CONVERTERS/26.3) or a self-developed technique to realize the analog-to-digital converter 510.

Since people of ordinary skill in the art can appreciate the detail and modification of the embodiment of FIG. 5 by referring the disclosure of the embodiments of FIGS. 1~4, which means that each feature of the embodiments of FIGS. 1~4 can be applied to the embodiment of FIG. 5 in a reasonable manner, repeated and redundant description is omitted here.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the dual-path AFE circuit and the dual-path signal receiver of the present invention can select an appropriate signal reception path with switch circuits to prevent unnecessary power consumption while the switch circuits have no need to be set on the signal reception path and will not degrade the linearity of the dual-path AFE circuit and the dual-path signal receiver.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A dual-path analog-front-end (AFE) circuit, comprising:
    a first reception circuit including:
        a first passive-component circuit configured to generate a first signal according to a reception signal in a first mode;
        a first switch circuit configured to electrically disconnect the first passive-component circuit from a first voltage terminal in the first mode and electrically connect the first passive-component circuit with the first voltage terminal in a second mode; and
        a first amplifier circuit configured to generate a first analog input signal according to the first signal in the first mode;
    a second reception circuit including:
        a second passive-component circuit configured to generate a second signal according to the reception signal in the second mode;
        a second switch circuit configured to electrically disconnect the second passive-component circuit from a second voltage terminal in the second mode and electrically connect the second passive-component circuit with the second voltage terminal in the first mode; and
        a second amplifier circuit configured to generate a second analog input signal according to the second signal in the second mode; and
    a multiplexer electrically connected with the first reception circuit and the second reception circuit, the multiplexer configured to output the first analog input signal in the first mode and output the second analog input signal in the second mode.

2. The dual-path AFE circuit of claim 1, wherein power consumption of the first amplifier circuit in the first mode is more than power consumption of the second amplifier circuit in the second mode.

3. The dual-path AFE circuit of claim 2, wherein the reception signal is a wired transmission signal, the first mode is a long-distance transmission mode, and the second mode is a short-distance transmission mode.

4. The dual-path AFE circuit of claim 1, wherein the first reception circuit and the second reception circuit are connected in parallel, the first passive-component circuit includes a first resistor and a first capacitor connected in series, and the second passive-component circuit includes a second resistor and a second capacitor connected in series.

5. The dual-path AFE circuit of claim 4, wherein a terminal of the first switch circuit is electrically connected with a first node between the first resistor and the first capacitor, another terminal of the first switch circuit is electrically connected with the first voltage terminal, a terminal of the second switch circuit is electrically connected with a second node between the second resistor and the second capacitor, and another terminal of the second switch circuit is electrically connected with the second voltage terminal.

6. The dual-path AFE circuit of claim 1, wherein the first amplifier circuit includes:
    a first input terminal of a first amplifier configured to receive the first signal;
    a first output terminal of the first amplifier configured to output the first analog input signal;
    the first amplifier configured to generate the first analog input signal according to the first signal and a first reference signal; and
    a first gain control circuit electrically connected between the first input terminal and the first output terminal;
and the second amplifier circuit includes:
    a second input terminal of a second amplifier configured to receive the second signal;
    a second output terminal of the second amplifier configured to output the second analog input signal;
    the second amplifier configured to generate the second analog input signal according to the second signal and a second reference signal; and
    a second gain control circuit electrically connected between the second input terminal and the second output terminal.

7. The dual-path AFE circuit of claim 6, wherein the first gain control circuit includes at least one first adjustable passive component and the second gain control circuit includes at least one second adjustable passive component.

8. The dual-path AFE circuit of claim 1, wherein a voltage of the first voltage terminal is a first constant voltage and a voltage of the second voltage terminal is a second constant voltage.

9. The dual-path AFE circuit of claim 8, wherein the first constant voltage is equal to the second constant voltage.

10. The dual-path AFE circuit of claim 1, wherein the dual-path AFE circuit is included in a ten gigabit Ethernet receiver.

11. A dual-path signal receiver, comprising:
    a first reception circuit configured to generate a first analog input signal according to a reception signal in a first mode and configured to be electrically connected to a first voltage terminal via a first switch circuit in a second mode;
    a second reception circuit configured to generate a second analog input signal according to the reception signal in the second mode and configured to be electrically connected to a second voltage terminal via a second switch circuit in the first mode;
    a multiplexer electrically connected to the first reception circuit and the second reception circuit, the multiplexer configured to output the first analog input signal in the first mode and output the second analog input signal in the second mode; and
    an analog-to-digital converter configured to generate a first digital signal according to the first analog input signal in the first mode and generate a second digital signal according to the second analog input signal in the second mode.

12. The dual-path signal receiver of claim 11, wherein power consumption of the first reception circuit in the first mode is more than power consumption of the second reception circuit in the second mode.

13. The dual-path signal receiver of claim 11, wherein the dual-path signal receiver is a ten gigabit Ethernet receiver.

14. The dual-path signal receiver of claim 11, wherein a voltage of the first voltage terminal is a first constant voltage and a voltage of the second voltage terminal is a second constant voltage.

15. The dual-path signal receiver of claim 14, wherein the first constant voltage is equal to the second constant voltage, and each of the first constant voltage and the second constant voltage is a power supply voltage or a ground voltage.

16. The dual-path signal receiver of claim 11, wherein a number of bits of the first digital signal is more than a number of bits of the second digital signal.

* * * * *